United States Patent
Sato et al.

(10) Patent No.: US 6,859,053 B1
(45) Date of Patent: Feb. 22, 2005

(54) PROBE APPARATUS MANUFACTURING METHOD THEREOF AND SUBSTRATE INSPECTING METHOD USING THE SAME

(75) Inventors: Kenji Sato, Moriyama (JP); Hiromitu Wada, Kusatu (JP); Fujio Murai, Yokaichi (JP); Koichi Mimura, Otsu (JP); Masanori Akita, Otsu (JP)

(73) Assignee: Toray Engineering Co., Ltd., Osaka (JP)

( * ) Notice: Subject to any disclaimer, the term of this patent is extended or adjusted under 35 U.S.C. 154(b) by 0 days.

(21) Appl. No.: 10/111,102

(22) PCT Filed: Nov. 13, 2000

(86) PCT No.: PCT/JP00/08024

§ 371 (c)(1),
(2), (4) Date: Apr. 22, 2002

(87) PCT Pub. No.: WO01/36987

PCT Pub. Date: May 25, 2001

(51) Int. Cl.⁷ .......................... G01R 31/28; H01R 43/00
(52) U.S. Cl. .......................... 324/754; 29/825; 324/765
(58) Field of Search ................................ 324/754, 762, 324/765, 72.5; 29/825

(56) References Cited

U.S. PATENT DOCUMENTS 4,161,692 A * 7/1979 Tarzwell .................... 324/754
5,621,333 A * 4/1997 Long et al. ................. 324/762

FOREIGN PATENT DOCUMENTS

| JP | 03-218473 | 9/1991 |
| JP | 08-254677 | 10/1996 |
| JP | 09-054116 | 2/1997 |
| JP | 09-281459 | 10/1997 |
| JP | 10-288627 | 10/1998 |

OTHER PUBLICATIONS

International Search Report PCT/JP00/08024 mailed on Feb. 20, 2001.

* cited by examiner

*Primary Examiner*—Ernest Karlsen
(74) *Attorney, Agent, or Firm*—Rader, Fishman & Grauer PLLC

(57) ABSTRACT

In a probe apparatus comprising an inspecting device, an intermediate substrate and a probe substrate, in which the inspecting device is electrically connected to a proximal end of the intermediate substrate, and the intermediate substrate has a distal end electrically connected to a proximal end of the probe substrate, and the probe substrate has a distal end electrically connectable to a substrate under inspection, a plurality of probe substrates are electrically connected to the single intermediate substrate. When a particular probe substrate 4 is damaged, only the particular probe substrate 4 may be changed, the other probe substrates 4 continuing to be used, thereby achieving economy.

17 Claims, 7 Drawing Sheets

PROBE APPARATUS MANUFACTURING METHOD THEREOF AND SUBSTRATE INSPECTING METHOD USING THE SAME

CROSS REFERENCE TO RELATED APPLICATIONS

This Application is a 371 of PCT/JP00/08024, filed Nov. 13, 2000.

TECHNICAL FIELD

The present invention relates to a probe apparatus for use in inspecting liquid crystal panels and the like, a manufacturing method thereof, and a substrate inspecting method using this apparatus.

BACKGROUND ART

As is well known, various types of probe apparatus are widely used in inspecting liquid crystal panels and the like (hereinafter referred to as substrates under inspection).

One example of conventional apparatus will be described with reference to FIGS. 9 and 10. FIG. 9 is a front view of such a conventional probe apparatus in an inspecting situation, and FIG. 10 is a plan view thereof.

This probe apparatus comprises an inspecting device 10, an intermediate substrate 3 and a probe substrate 4. The inspecting device 10 is electrically connected to a proximal end e1 of the intermediate substrate 3. The intermediate substrate 3 has a distal end e2 electrically connected to a proximal end b1 of the probe substrate 4. The probe substrate 4 has a distal end b2 electrically connectable to a substrate 11 under inspection. The inspecting device 10 includes TAB (Tape Automate bonding) packages 2, a control substrate 1, and a signal generator 9. The signal generator 9 is electrically connected to the control substrate 1 through a signal transmission line 12. The control substrate 1 is electrically connected to proximal ends c2 of the TAB packages 2. The TAB packages 2 have distal ends c1 electrically connected to the proximal end e1 of the intermediate substrate 3.

Each of the control substrate 1, intermediate substrate 3 and probe substrate 4 has an elongated rectangular shape. A plurality of TAB packages 2 are arranged at predetermined intervals between the control substrate 1 and the intermediate substrate 3.

The probe substrate 4 has a plurality of inspecting terminals 4a juxtaposed at micro intervals, e.g. of 50 $\mu$m. The inspecting terminals 4a have distal ends thereof precisely positioned relative to a plurality of pads formed on the substrate 11 under inspection. The inspecting terminals and pads are placed in pressure contact to be conductive with each other, thereby allowing a predetermined inspection to be carried out.

However, each inspecting terminal 4a has a minute width, e.g. of 20 $\mu$m, and thus is prone to damage when the probe substrate 4 is pressed by a pressure head to place the inspecting terminals 4a in pressure contact with the pads of the substrate 11 under inspection. In addition, it is necessary to replace the entire probe substrate 4 with a new substrate, due to its elongated one-piece formation, even when one of the inspecting terminals 4a becomes defective because of disconnection or the like. Such a replacement is costly while amounting to a poor yield, which results in an economic disadvantage.

Generally, the above probe apparatus has "the probe substrate 4 and the intermediate substrate 3" and "the intermediate substrate 3 and the TAB packages 2" joined, through an ACF (Anisotropic Conductive Film), respectively, and "the TAB packages 2 and the control substrate 1" joined by solder. Thus, the probe substrate 4 formed of polymer resin film is easily deformable under the influences of heat, stress and the like. As a result, the more the probe substrate is elongated, the more often the intervals become irregular between the inspecting terminals 4a, which impedes improvement in the accuracy of terminal patterns. Even if the probe apparatus may be manufactured with high precision, some disadvantages remain in that the intervals between the inspecting terminals 4a are likely to become irregular due to subsequent changes in environmental conditions, and that the probe substrate 4 has a relatively short life (i.e. a period over which a high precision condition can be maintained).

Further, due to the above-described disadvantages, it is difficult to maintain a precise registration between the numeral inspecting terminals 4a and the pads of the substrate 11 under inspection in a constant state during an inspection. This hampers a stable inspection.

The present invention has been made having regard to the drawbacks noted above, and its primary object is to provide a probe apparatus for enabling an economic replacement by a new probe substrate in the event of a defect such as a disconnection.

A second object of the invention is to provide a durable probe apparatus which is manufactured with a reduced irregularity in the intervals of inspecting terminals of a probe substrate to enhance the accuracy of terminal patterns, and which maintains such accuracy over a long period after its manufacture.

A third object of the invention is to provide a method of effecting a stable inspection using such a probe apparatus.

DISCLOSURE OF THE INVENTION

In order to fulfill the above primary object, the present invention provides a probe apparatus comprising an inspecting device, an intermediate substrate and a probe substrate, said inspecting device being electrically connected to a proximal end of said intermediate substrate, said intermediate substrate having a distal end electrically connected to a proximal end of said probe substrate, said probe substrate having a distal end electrically connectable to a substrate under inspection, characterized in that a plurality of probe substrates are juxtaposed for a single intermediate substrate.

That is, according to the present invention, when a particular probe substrate is damaged, only the particular probe substrate may be changed, the other probe substrates continuing to be used, thereby achieving economy.

In the probe apparatus according to the present invention, said inspecting device includes, for example, a control substrate electrically connected to a signal generator, and a plurality of TAB (Tape Automated bonding) packages, said plurality of TAB packages each having a proximal end electrically connected to said control substrate and a distal end electrically connected to the proximal end of said intermediate substrate. It is not absolutely necessary for the control substrate to be directly connected to the plurality of TAB packages. It may be electrically connected through a plurality of connecting substrates.

In place of the plurality of TAB packages, a plurality of driving integrated circuit elements may be mounted on the intermediate substrate, distal ends of the driving integrated circuit elements being electrically connected to the proximal ends of the plurality of probe substrates. In this case as well, it is not absolutely necessary to directly interconnect the control substrate and each driving integrated circuit element, but they may be electrically interconnected through a plurality of connecting substrates.

Preferably, the above plurality of connecting substrates comprise FPCs (Flexible Printed Circuit) and are bent for connection. This construction facilitates replacement of the TAB packages and driving integrated circuit elements.

In the present invention, it is preferred that said intermediate substrate is formed of an inorganic material. Since an inorganic material is not readily deformed under the influence of heating in time of joining or by changes in environmental conditions, which may enhance the accuracy for connecting the intermediate substrate to the probe substrates. As the inorganic material, a ceramic material is particularly desirable. Further, the intermediate substrate, preferably, has a coefficient of hygroscopic expansion not exceeding 1 ppm/% RH in order to avoid the influence of its dimensional variations caused by moisture absorption.

In the present invention, it is preferred that said intermediate substrate is at least 2.5 times as thick as said probe substrate. With this construction, the intermediate substrate may have a rigidity greater than that of the probe substrate, as a result of which deformation of the probe substrate may be restrained.

In the present invention, said probe substrate comprises an FPC (Flexible Printed Circuit), for example. Preferably, the probe substrate has a coefficient of hygroscopic expansion not exceeding 10 ppm/% RH in order to reduce the unevenness in the intervals between the inspecting terminals of the probe substrate and to maintain the accuracy of the inspecting terminals over a long period.

In the present invention, said probe substrate includes, for example, a plurality of inspecting terminals arranged thereon, proximal ends of these inspecting terminals being connected to distal ends of a plurality of electrodes arranged on said intermediate substrate, distal ends of said inspecting terminals being connectable to a plurality of pads arranged on said substrate under inspection. In this probe apparatus, said inspecting terminals of said probe substrates, preferably, have a width smaller than a width of said pads and a space between said pads of said substrate under inspection. This construction provides an increased tolerance for the accuracy of positioning of inspecting terminals relative to the pads of the substrate under inspection, which prevents short circuits occurring between the adjacent pads.

In order to prevent the distal ends of the inspecting terminals from being separated from the probe substrate, it is preferable that the distal ends of the inspecting terminals of the probe substrates are positioned inwardly of an edge at the distal end of the probe substrate.

Further, a method of manufacturing the probe apparatus according to the present invention is characterized in that said probe substrates, with intervals p3 for forming the inspecting terminals at the distal ends of said probe substrates to be connected to the pads of said substrate under inspection being larger than intervals for forming said pads, and intervals p4 for forming the inspecting terminals at the proximal ends of said probe substrates to be connected to said electrodes of the intermediate substrate being smaller than intervals for forming said electrodes of said intermediate substrate, are joined to said intermediate substrate by thermo compression bonding, using one of ACF (Anisotropic Conductive Film), ACP (Anisotropic Conductive Paste), NCF (Non-conductive Film) and NCP (Non-conductive Paste). According to this manufacturing method, the intervals p4 for forming the inspecting terminals at the proximal ends of the probe substrates to be connected to the electrodes of the intermediate substrate are smaller than the intervals p2 for forming the electrodes of the intermediate substrate. When the probe substrates having a larger coefficient of thermal expansion than the intermediate substrate is joined to the intermediate substrate, the proximal ends of the probe substrates are thermally expanded to a relatively large extend. Consequently, the intervals of the electrodes of the intermediate substrate become substantially equal to the intervals of the inspecting terminals of the probe substrate. This enhances the yield of joining. As the probe substrates are thermally expanded at the distal ends thereof, they are contracted at the proximal ends thereof. According to the manufacturing method of the present invention, since the intervals p3 for forming the inspecting terminals at the distal ends of the probe substrates to be connected to the pads of the substrate under inspection are larger than the intervals p1 for forming the pads, the probe substrates are contracted at the distal ends thereof, thereby to make the intervals of the terminals at the distal ends of the probe substrates substantially equal to the intervals of the pads of the substrate under inspection.

A method of inspecting a substrate by using a probe apparatus according to the present invention is characterized in that a difference in coefficient of thermal expansion between said intermediate substrate and said substrate under inspection is 5 ppm/° C. or less. According to this substrate inspecting method, since the difference in coefficient of thermal expansion between the intermediate substrate and the substrate under inspection is slight, the intervals for forming the inspecting terminals on the probe substrate connected to the intermediate substrate become substantially equal to the intervals for forming the pads on the substrate under inspection, to enable a stable inspection.

BEST MODE FOR CARRYING OUT THE INVENTION

Preferred embodiments of the present invention will be described hereinafter with reference to the drawings.

Figure 1:
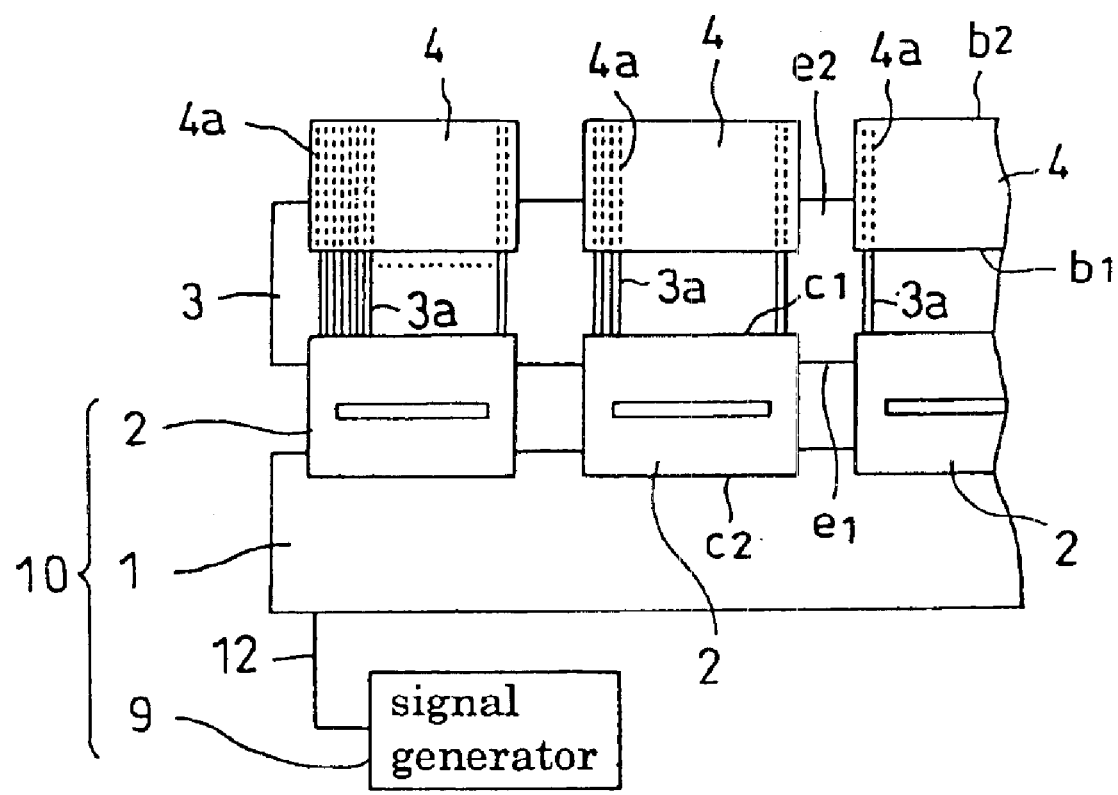
FIG. 1 is a plan view showing one example of probe apparatus according to the present invention.
Figure 9:
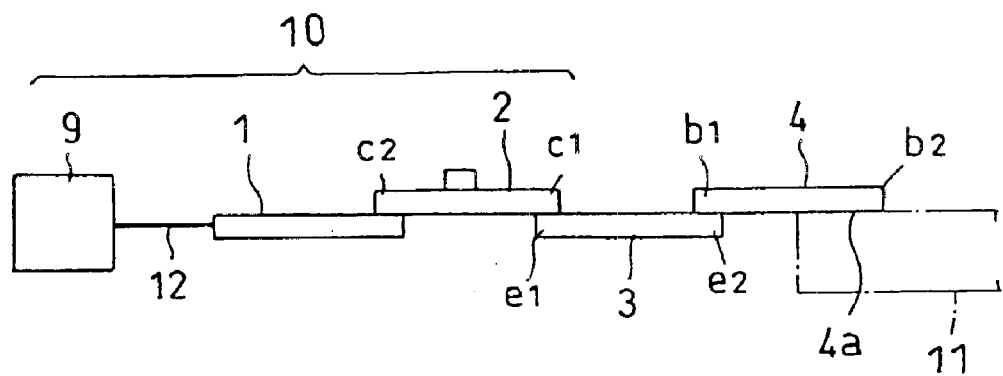
FIG. 9 is a front view of a conventional probe apparatus in an inspecting situation.
Figure 10:
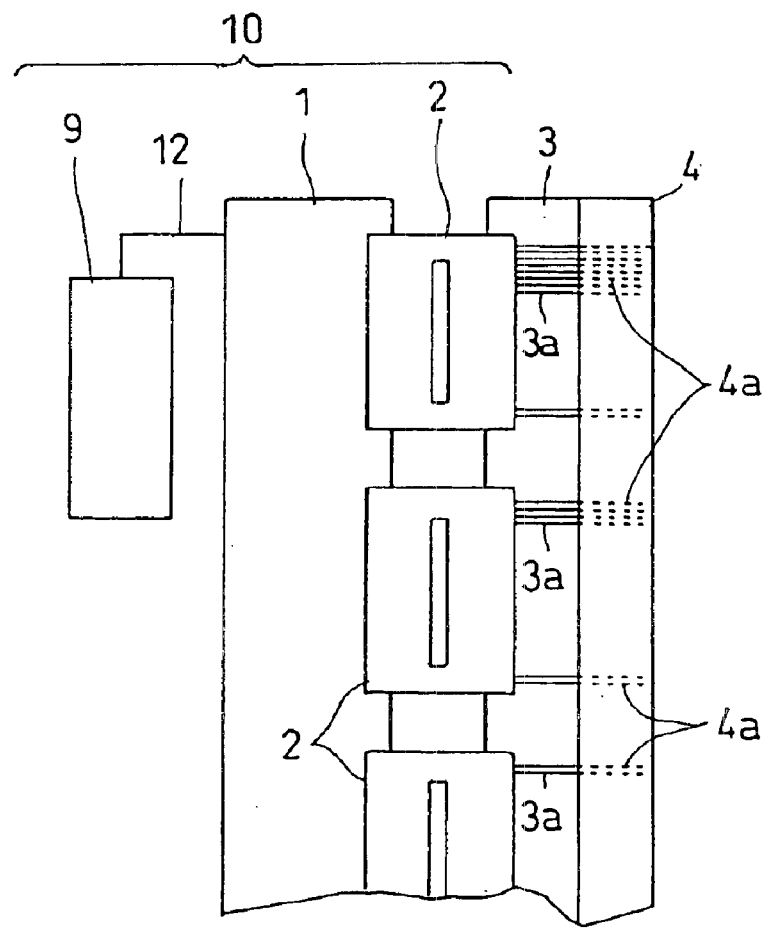
FIG. 10 is a plan view of the apparatus shown in FIG. 9.

FIG. 1 is a plan view of a probe apparatus in one embodiment of the present invention. A side view of the probe apparatus in this embodiment is similar to FIG. 9.

As shown, the probe apparatus comprises an inspecting device 10, one intermediate substrate 3, and a plurality of probe substrates 4. The intermediate substrate 3 has an elongated rectangular shape (e.g. at least 200 mm), and the inspecting device 10 is electrically connected to a proximal end e1 of the intermediate substrate 3. The plurality of probe substrates 4, each having a short rectangular shape (e.g. in the order of 20 mm), are juxtaposed at predetermined intervals along an edge at a distal end e2 of the intermediate substrate 3. Each probe substrate 4 has a proximal end b1 electrically connected to the distal end e2 of the single intermediate substrate 3. A distal end b2 of each probe substrate 4 is electrically connectable to a substrate 11 under inspection (cf. FIG. 9) through pressure contact.

The inspecting device 10 includes a plurality of TAB (Tape Automated bonding) packages 2, a control substrate 1 having an elongated rectangular shape (e.g. at least 200 mm), and a signal generator 9. The TAB packages 2 are packages for sealing integrated circuit elements, which have a heat-resistant film such as of polyimide resin laminated with a metal film such as copper foil, and etched to define wiring patterns. In this embodiment, driving integrated circuit elements are sealed in each TAB package 2 for lighting and driving the substrate 11 under inspection, e.g. a liquid crystal panel. Each TAB package 2 has groups of electrodes arranged at a proximal end c2 thereof (adjacent the control substrate 1) and at a distal end c1 (adjacent the intermediate substrate 3), respectively. The proximal end c2 of each TAB package 2 is electrically connected to the control substrate 1, and the distal end c1 of each TAB package 2 to the proximal end e1 of the intermediate substrate 3. The signal generator 9 is also electrically connected to the control substrate 1.

To be "electrically connected" as used herein means to be a conductive state. For example, distal ends of a plurality of electrodes 3a formed on the intermediate substrate 3 are joined to proximal ends of a plurality of inspecting terminals 4a formed on the probe substrates 4 to be in the conductive state. Similarly, proximal ends of the plurality of electrodes 3a formed on the intermediate substrate 3 are joined to distal ends of the plurality of electrodes formed on each TAB package 2 to be in the conductive state. Also, proximal ends of the plurality of electrodes formed on each TAB package 2 are joined to a plurality of electrodes formed on the control substrate 1 to be in the conductive state.

The TAB packages 2 and the control substrate 1 are soldered to each other to be in the conductive state. However, a different joining method such as ACF or compression bonding may be employed. The control substrate 1 and the signal generator 9 are in a conductive state a signal transmission line 12. The probe substrates 4 and the intermediate substrate 3 are joined together through ACF (Anisotropic Conductive Film) to be in a conductive state. In a similar way, the intermediate substrate 3 and the TAB packages 2 are joined through ACF to be in a conductive state. The ACF is a connecting material having three functions of adhesion, conduction and insulation at the same time, and comprising an electrically anisotropic polymer film having, when thermo compression bonded, electrical anisotropy with conductivity in the direction of film thickness and insulating property in a direction of plane. This film is formed by mixing conductive particles into a polymeric material having adhesive and insulating properties.

Each probe substrate 4 is an FPC (Flexible Printed Circuit) comprising an insulating substrate made of an organic material such as low hygroscopicity glass epoxy, liquid crystal polymer, polyimide, polyphenylene oxide, polyphenylene ethyl ether or the like, and conductive electrodes formed of copper, nickel, gold or the like on the insulating substrate. Although the probe substrate having a coefficient of hygroscopic expansion not exceeding 10 ppm/% RH is used here, it is preferable to use one having a coefficient of hygroscopic expansion not exceeding 5 ppm/% RH.

Where the probe substrates 4 comprise glass epoxy substrates, the electrode conduction tends to become uneven in time of pressure connection and cracks tend to occur when pressure is repeatedly applied. These disadvantages may be overcome by employing a heat-resistant film such as polyimide film.

The intermediate substrate 3 comprises an insulating substrate made of an inorganic material such as glass, alumina, aluminum nitride, silicon carbide, mullite or other ceramic material, or a metallic material having a low coefficient of thermal expansion and coated with ceramic, and conductive electrodes formed of ITO (Indium Tin Oxide), aluminum, chrome or the like on the insulating substrate. The intermediate substrate having a coefficient of hygroscopic expansion not exceeding 1 ppm/% RH is used. The difference in the coefficient of thermal expansion between the intermediate substrate 3 and the substrate under inspection is set to 5 ppm/° C. or less.

In this probe apparatus, as described above, the coefficients of hygroscopic expansion of the probe substrates 4 and intermediate substrate 3 are set within the above ranges, which enable the electrodes 3a of the intermediate substrate 3 to join the inspecting terminals 4a of the probe substrates 4 with high accuracy.

More particularly, where each probe substrate 4 with a total length of 30 mm has a coefficient of hygroscopic expansion at 10 ppm/% RH, the total length of the substrate is increased or decreased by 12 $\mu$m with a humidity increase or decrease by 40%. Since the intervals between the inspecting terminals 4a are typically 50 $\mu$m, it is preferable to set the coefficient of hygroscopic expansion of the probe substrates 4 to 10 ppm/% RH or less.

Where the difference in the coefficient of thermal expansion (commonly referred to as CTE) between the intermediate substrate 3 and the substrate 11 under inspection is 5 ppm/° C., the total length 300 mm of the intermediate substrate 3 increases by 15 $\mu$m with a temperature increases of 10° C. In view of this also, it is preferable to set the difference in the coefficient of thermal expansion between the intermediate substrate 3 and the substrate 11 under inspection to 5 ppm/° C. or less.

In order that dimensional variations of the probe substrates 4 may not affect deformation of the intermediate substrate 3, the intermediate substrate 3 preferably is at least 2.5 times as thick as the probe substrates 4. The inspecting terminals 4a of the probe substrates 4 and the electrodes 3a of the intermediate substrate 3 are formed in predetermined patterns by a semi-additive method and a subtract method, respectively, but may be formed by other methods.

Figure 2A:
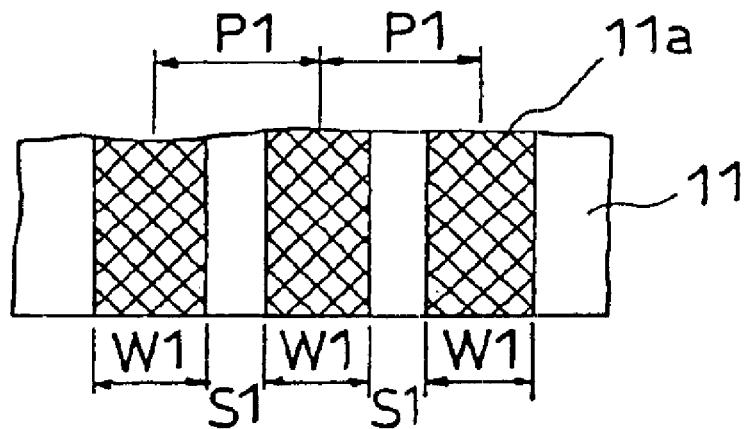
FIG. 2 shows a relationship between pads of a substrate under inspection, inspecting terminals of a probe substrate, and electrodes of an intermediate substrate, in which: (A) is a plan view of the pads of the substrate under inspection, (B) is a plan view of the inspecting terminals of the probe substrate, and (C) is a plan view of the electrodes of the intermediate substrate.
Figure 2B:
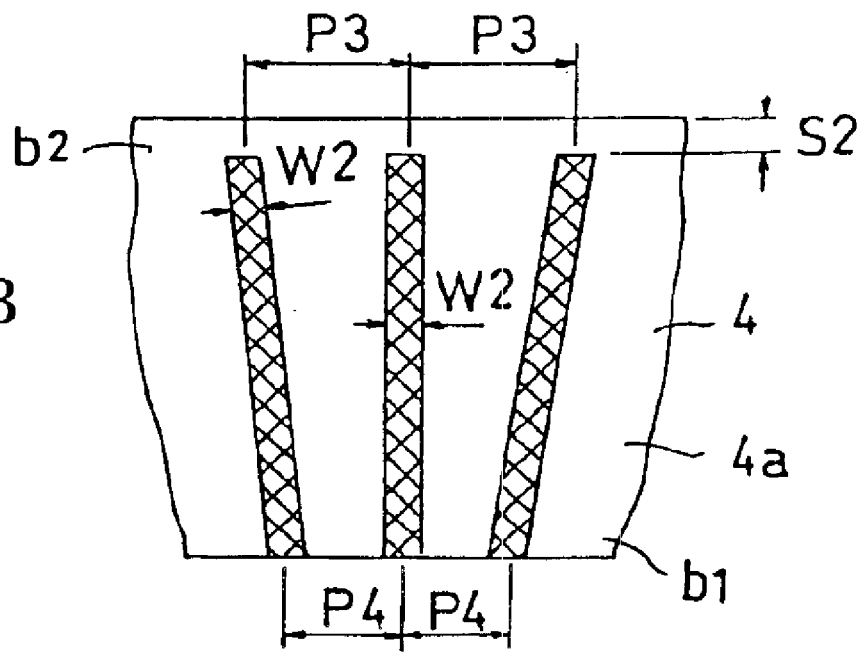
Figure 2C:
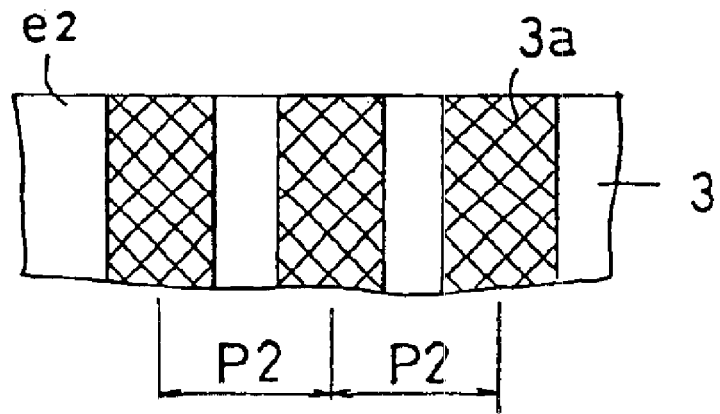

FIG. 2(A) shows conductive pads 11a formed on the substrate 11 under inspection, FIG. 2(B) shows the inspecting terminals 4a formed on each probe substrate 4, and FIG. 2(C) shows the electrodes 3a formed on the intermediate substrate 3. The plurality of inspecting terminals 4a formed on each probe substrate 4 to be connected to the plurality of pads 11a formed on the substrate 11 under inspection have a width w2 smaller than a width w1 of each pad 11a and a space s1 between the pads 11a.

As a result, an increased tolerance of accuracy is allowed for positioning the group of inspecting terminals 4a relative to the group of pads 11a when the distal ends b2 of the probe substrates 4 are connected to the substrate 11 under inspection. This effectively prevents short circuits occurring between adjacent pads 11a.

With this probe apparatus, the group of inspecting terminals 4a at the distal ends of the probe substrates 4 to be connected to the group of pads 11a of the substrate 11 under inspection are arranged at intervals p3 larger than intervals p1 between the pads 11a. The inspecting terminals 4a at the proximal end of the probe substrate 4 connected to the group of electrodes 3a of the intermediate substrate 3 are arranged at intervals p4 smaller than intervals p2 between the electrodes 3a of the intermediate substrate 3. Such probe substrates 4 are manufactured by attaching ACF to the intermediate substrate 3 by thermo compression bonding.

As a result, it is possible to cope with interval variations caused by a thermal extension occurring at the proximal ends of the probe substrates 4 and by a contraction occurring at the distal ends of the probe substrates 4 when the probe substrate 4 and the intermediate substrate 3 are electrically connected together. Thus, the probe apparatus is provided with constant accuracy (with reduced variations in accuracy).

The group of inspecting terminals 4a of each probe substrate 4 is arranged such that each inspecting terminal 4a has a distal end positioned inwardly of the edge at the distal end of the probe substrate 4 by s2 (e.g. 0.1–0.2 mm). This prevents the inspecting terminals 4a from being separated at the distal ends when the probe substrate 4 is connected to the substrate 11 under inspection.

Instead of the ACF used for connecting the probe substrates 4 to the intermediate substrate 3, any one of ACP (Anisotropic Conductive Paste), NCF (Non-conductive Film) and NCP (Non-conductive Paste) may be used. As is ACF, ACP is a connecting material in paste form having the three functions of adhesion, conduction and insulation at the same time. NCF and NCP are a film-type connecting material or paste-type connecting material having an isolating function.

With this probe apparatus, it is possible to electrically connect, by pressure contact, the inspecting terminals 4a of the probe substrates 4 to the pads 11a of the substrate 11 under inspection (e.g. a liquid crystal panel), to carry out a required inspection. At that time, the signal generator 9 produces lighting pattern signals.

The control substrate 1 includes a circuit for converting levels of the signals. Since, generally, the signal generator 9 is remote from the control substrate 1, the signals are transmitted therebetween with a noise countermeasure. The control substrate 1 converts a signal received from the signal generator 9 to an LVDS (Low Voltage Differential Signal) for application to the TAB packages 2.

The TAB packages 2 receive a lighting pattern signal and generate a voltage for driving the substrate 11 under inspection. Thus, a visual inspection is effected where the substrate 11 under inspection is a liquid crystal panel or the like.

As described above, the probe apparatus according to the present invention includes the plurality of probe substrates 4 arranged at predetermined intervals for the single elongated intermediate substrate 3. As a result, when one of the probe substrates 4 becomes defective due to a disconnection or the like, only the particular defective substrate 4 may be changed. In this way, the probe substrates 4 may be changed economically.

The intermediate substrate 3 is formed of an inorganic material that is not easily subjected to the influence of humidity during a manufacturing process. The intermediate substrate 3 has a coefficient of hygroscopic expansion not exceeding 1 ppm/% RH. The probe substrates 4 are connected to such intermediate substrate 3. This effectively reduces the instability of manufacturing accuracy caused by the influence of humidity when the probe apparatus is manufactured. As a result, interval variations of the inspecting terminals 4a can be reduced to enhance the accuracy of terminal patterns.

The apparatus also employs the probe substrate 4 having a coefficient of hygroscopic expansion not exceeding 10 ppm/% RH. Thus, it is possible to further reduce the instability of manufacturing accuracy caused by the influence of humidity, to further enhance the accuracy of terminal patterns, and to maintain the accuracy over a long period after manufacture.

Since the width w2 of each of the inspecting terminals 4a formed on the probe substrates 4 to be connected to the group of pads 11a formed on the substrate 11 under inspection is smaller than the width w1 of each pad 11a and the space s1 between the pads 11a, an increased tolerance of accuracy is allowed for positioning the group of inspecting terminals 4a relative to the group of pads 11a, thereby preventing short circuits occurring between adjacent pads 11a.

Since the difference in the coefficient of thermal expansion between the intermediate substrate 3 and the substrate 11 under inspection is set to 5 ppm/° C. or less, it is possible to carry out a stable inspection. Moreover, since the intermediate substrate 3 is at least 2.5 times as thick as the probe substrates 4, it is possible to carry out an inspection with increased stability.

Figure 3:
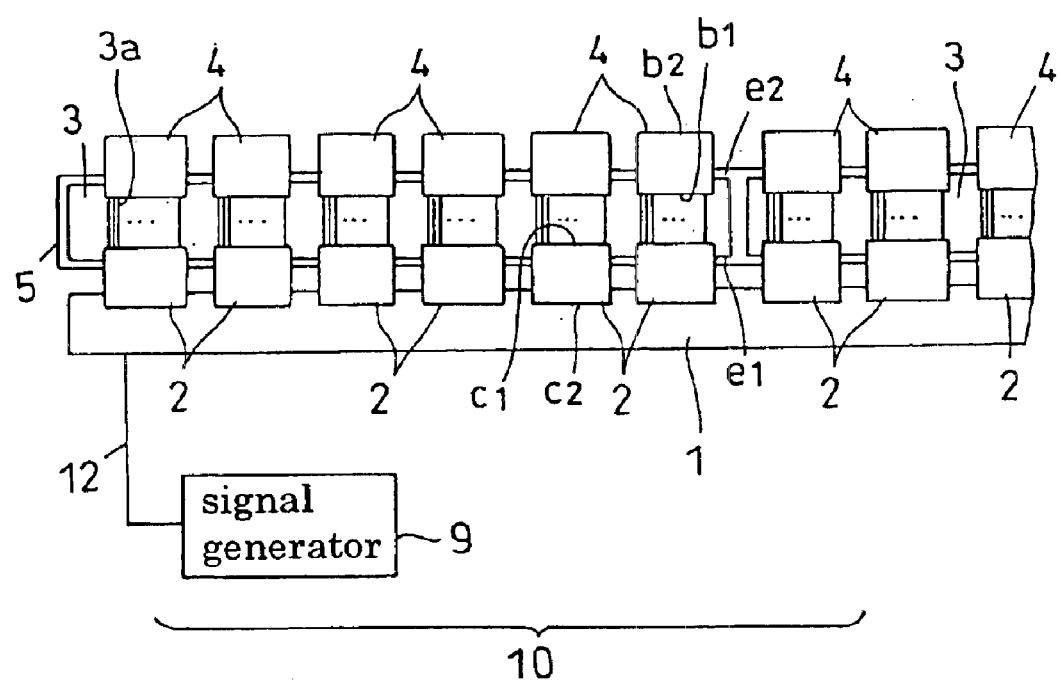
FIG. 3 is a plan view showing another example of probe apparatus according to the present invention.
Figure 4:
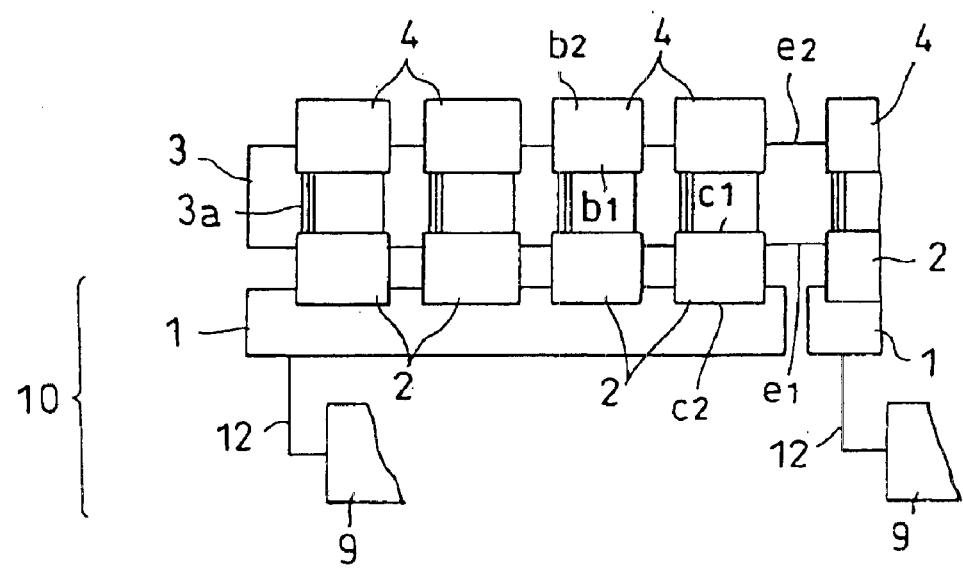
FIG. 4 is a plan view showing a further example of probe apparatus according to the present invention.
Figure 5:
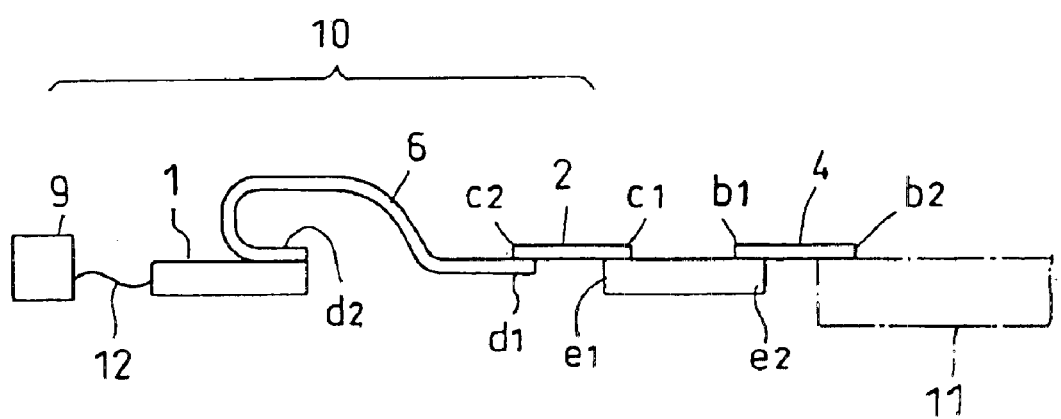
FIG. 5 is a front view showing a further example of probe apparatus according to the present invention.

While the probe apparatus in according to the present invention has been described in relation to one embodiment, the present invention may implemented in other forms, such as those shown in FIGS. 3 through 5.

The above probe apparatus shown in FIG. 1 includes a single intermediate substrate 3. FIG. 3 shows a probe apparatus including a plurality of intermediate substrates 3. These intermediate substrates 3 are bonded to a single elongated rectangular reinforcing plate 5 formed of the same material as the intermediate substrates 3. As illustrated, a plurality of (six in this embodiment) TAB packages 2 are electrically connected to each intermediate substrate 3.

A probe apparatus shown in FIG. 4 is different from the foregoing embodiments in that a plurality of control substrates 1 are provided. In this embodiment also, a plurality of (four in this embodiment) TAB packages 2 are electrically connected to each control substrate 1.

In FIG. 5, the control substrate 1 is not directly connected to each TAB package 2 as in the foregoing embodiments (embodiments of FIGS. 1, 3 and 4). Instead, they are electrically interconnected indirectly through a connecting substrate 6. The connecting substrate 6 is in the form of an FPC (Flexible Printed Circuit). The connecting substrate 6 is joined to the control substrate 1 in a bend and press mode as shown. The connecting substrate 6 has a sufficient length so that the TAB packages may be changed easily.

Figure 6:
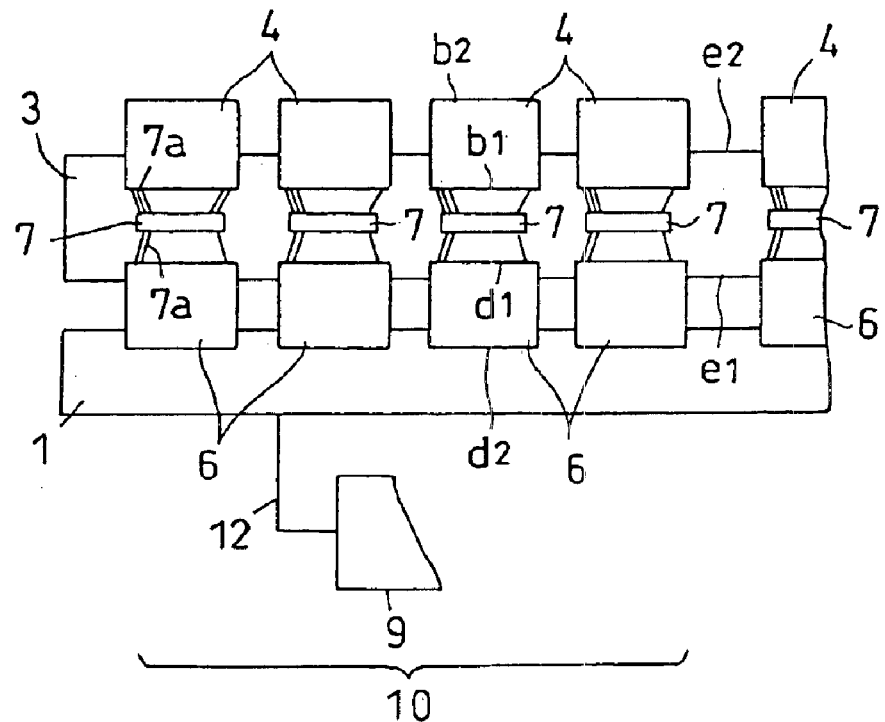
FIG. 6 is a plan view showing a further example of probe apparatus according to the present invention.

Further, a probe apparatus shown in FIG. 6 includes driving integrated circuit elements 7 mounted on the intermediate substrate 3, as replacements for the TAB packages 2. The probe substrates 4 and the connecting substrates 6 are electrically connected to the driving integrated circuit elements 7.

More particularly, a plurality of driving integrated circuit elements 7 are mounted and arranged at predetermined regular intervals on the intermediate substrate 3 as illustrated. Each driving integrated circuit element 7 has electrodes 7a provided at a distal end thereof and electrically connected to a proximal end of the probe substrate 4. Electrodes 7a provided at a proximal end thereof are electrically connected to the control substrate 1 through the connecting substrate 6.

Each driving integrated circuit element 7 comprises a liquid crystal driving IC for switching each pixel on and off and selecting a level of brightness of the liquid crystal. On the other hand, each of the above TAB packages comprises a TAB tape defining a circuit and having a driving IC mounted thereon.

The above type (the type shown in FIG. 6) including the driving integrated circuit elements 7 directly mounted on the intermediate substrate 3 may dispense with a process of connecting the circuit elements to the TAB tape, and thus has the advantage of realizing low cost and coping with fine-defined patterns.

The intervals for bonding the TAB packages 2, probe substrates 4, connecting substrate 6 and driving integrated circuit elements 7 may be either constant or random, and predetermined intervals are selected as occasion demands.

Figure 7:
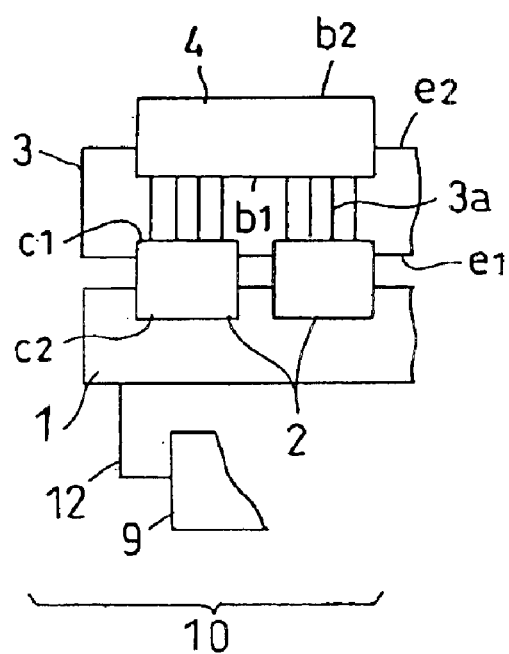
FIG. 7 is a plan view showing an example including a plurality of TAB packages for a single probe substrate.
Figure 8:
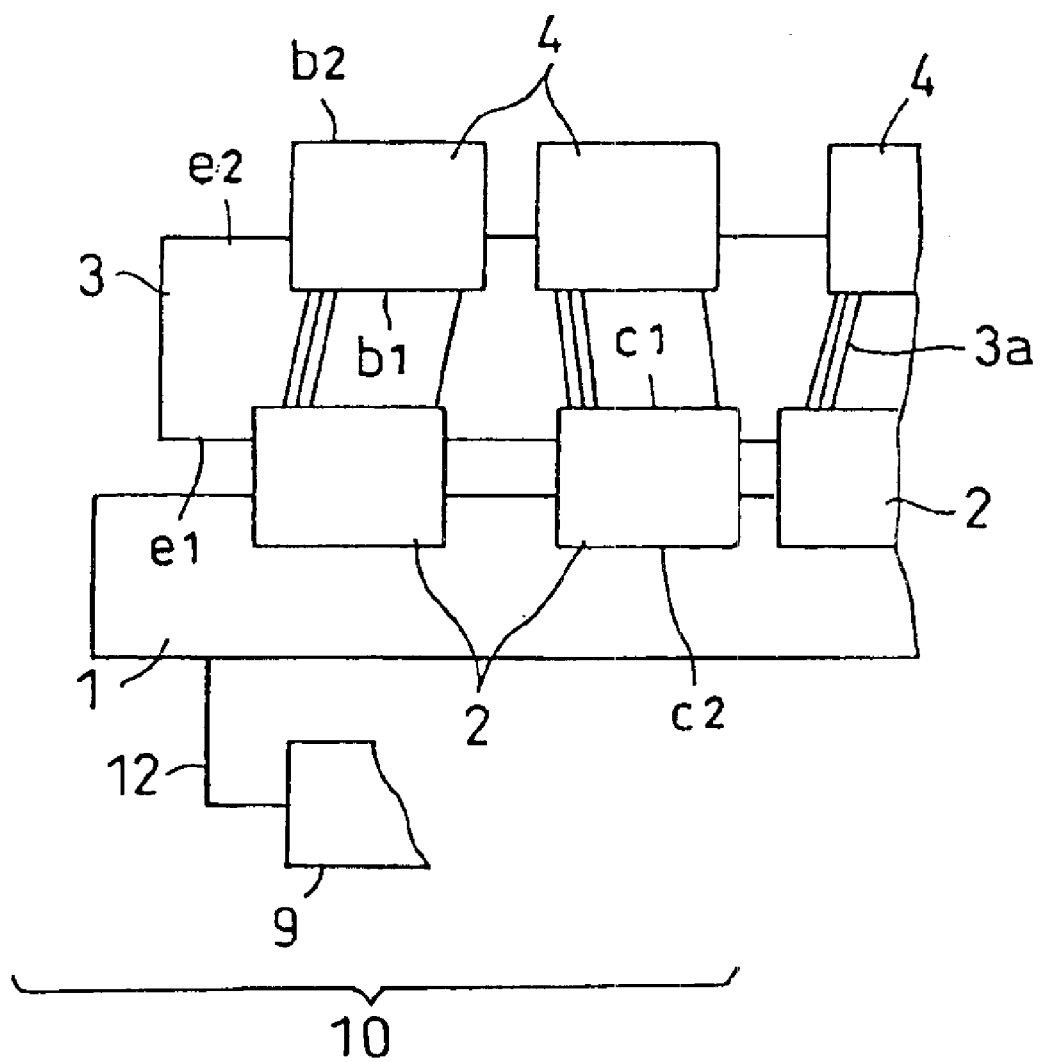
FIG. 8 is a plan view showing an example in which the TAB packages are shifted either to the right or left relative to the probe substrate.

Referring to FIG. 7, a plurality of (two in this embodiment) TAB packages 2 may be connected to a single probe substrate 4. Alternatively, as shown in FIG. 8, the TAB packages 2 may be shifted either to the right or left relative to the probe substrates 4.

INDUSTRIAL UTILITY

As described hereinbefore, the probe apparatus, manufacturing method thereof, and substrate inspecting method using the same according to the present invention enable the probe substrate to be changed economically and enhance the accuracy of the inspecting terminals of the probe substrate, and are thus well suited for inspecting substrates such as liquid crystal panels.

What is claimed is:

1. A probe apparatus comprising an inspecting device, an intermediate substrate and at least one probe substrate, said inspecting device including a signal generator, a plurality of TAB (Tape Automated Bonding) packages and a control substrate electrically interconnecting the plurality of TAB packages and the signal generator and being electrically connected to a proximal end of said intermediate substrate at the plurality of TAB packages, said intermediate substrate having a distal end electrically connected to a proximal end of said at least one probe substrate, said at least one probe substrate having a distal end electrically connectable to a substrate under inspection, said probe apparatus being characterized in that a plurality of probe substrates are disposed in a juxtaposed manner relative to each other and attached to a single intermediate substrate.

2. A probe apparatus as defined in claim 1, wherein said inspecting device includes said control substrate electrically connected to a signal generator, and said plurality of TAB (Tape Automated bonding) packages, said plurality of TAB packages each having a proximal end electrically connected to said control substrate and a distal end electrically connected to the proximal end of said intermediate substrate.

3. A probe apparatus as defined in claim 1, wherein said inspecting device includes a control substrate electrically connected to a signal generator, a plurality of connecting substrates, and a plurality of TAB (Tape Automated bonding) packages, said plurality of connecting substrates each having a proximal end electrically connected to said control substrate and a distal end electrically connected to a proximal end of one of said plurality of TAB packages, said plurality of TAB packages each having a distal end electrically connected to the proximal end of said intermediate substrate.

4. A probe apparatus as defined in claim 1, wherein said intermediate substrate includes a plurality of driving integrated circuit elements mounted thereon and each having a distal end connected to the proximal end of one of said plurality of probe substrates.

5. A probe apparatus as defined in claim 4, wherein said inspecting device includes a control substrate electrically connected to a signal generator, and a plurality of connecting substrates, said plurality of connecting substrates each having a proximal end electrically connected to said control substrate, and a distal end electrically connected to a proximal end of one of said plurality of driving integrated circuit elements.

6. A probe apparatus as defined in claim 3 or 5, wherein each of said connecting substrates comprises an FPC (Flexible Printed Circuit) and is bent for connection.

7. A probe apparatus as defined in any one of claims 1 to 5, wherein said intermediate substrate is formed of an inorganic material.

8. A probe apparatus as defined in claim 7, wherein said inorganic material comprises a ceramic material.

9. A probe apparatus as defined in claim 7, wherein said intermediate substrate has a coefficient of hygroscopic expansion not exceeding 1 ppm/% RH.

10. A probe apparatus as defined in any one of claims 1 to 5 wherein said intermediate substrate is at least 2.5 times as thick as said probe substrate.

11. A probe apparatus as defined in any one of claims 1 to 5, wherein said probe substrate comprises an FPC (Flexible Printed Circuit).

12. A probe apparatus as defined in claim 11, wherein said probe substrate has a coefficient of hygroscopic expansion not exceeding 10 ppm/% RH.

13. A probe apparatus as defined in claim 1, wherein said probe substrate includes a plurality of inspecting terminals arranged thereon, proximal ends of these inspecting terminals being connected to distal ends of a plurality of electrodes arranged on said intermediate substrate, distal ends of said inspecting terminals being connectable to a plurality of pads arranged on said substrate under inspection.

14. A probe apparatus as defined in claim 13, wherein said inspecting terminals of said probe substrates have a width smaller than a width of said pads and a space between said pads of said substrate under inspection.

15. A probe apparatus as defined in claim 13, wherein the distal end of each of said inspecting terminals of said probe substrates is positioned inwardly of an edge at the distal end of said probe substrate.

16. A method of manufacturing a probe apparatus having an inspecting device, an intermediate substrate and at least one probe substrate, the inspecting device including a signal generator, a plurality of TAB (Tape Automated Bonding) packages and a control substrate electrically interconnecting the plurality of TAB packages and the signal generator and being electrically connected to a proximal end of the intermediate substrate at the plurality of TAB packages, the intermediate substrate having a distal end electrically connected to a proximal end of the at least one probe substrate, the at least one probe substrate having a distal end electrically connectable to a substrate under inspection, the probe apparatus being characterized in that a plurality of probe substrates are disposed in a juxtaposed manner relative to each other and attached to a single intermediate substrate, the probe substrate includes a plurality of inspecting terminals arranged thereon, proximal ends of these inspecting terminals being connected to distal ends of a plurality of electrodes arranged on the intermediate substrate, distal ends of the inspecting terminals being connectable to a plurality of pads arranged on the substrate under inspection, the method comprising the step of manufacturing the probe apparaus characterized in that said probe substrates, with intervals p3 for forming the inspecting terminals at the distal ends of said probe substrates to be connected to the pads of said substrate under inspection being larger than intervals for forming said pads, and intervals p4 for forming the inspecting terminals at the proximal ends of said probe substrates to be connected to said electrodes of the intermediate substrate being smaller than intervals for forming said electrodes of said intermediate substrate, are joined to said intermediate substrate by thermo compression bonding, using one of ACF (Anisotropic Conductive Film), ACP (Anisotropic Conductive Paste), NCF (Non-conductive Film) and NCP (Non-conductive Paste).

17. A method of inspecting a substrate by using a probe apparatus having an inspecting device, an intermediate substrate and at least one probe substrate, the inspecting device including a signal generator, a plurality of TAB (Tape Automated Bonding) packages and a control substrate electrically interconnecting the plurality of TAB packages and the signal generator and being electrically connected to a proximal end of the intermediate substrate at the plurality of TAB packages, the intermediate substrate having a distal end electrically connected to a proximal end of the at least one probe substrate, the at least one probe substrate having a distal end electrically connectable to a substrate under inspection, the probe apparatus being characterized in that a plurality of probe substrates are disclosed in a juxtaposed manner relative to each other and attached to a single intermediate substrate, the method comprising the step of inspecting the substrate characterized in that a difference in coefficient of thermal expansion between said intermediate substrate and said substrate under inspection is 5 ppm/° C. or less.

* * * * *